United States Patent [19]
Goss et al.

[11] 4,312,068
[45] Jan. 19, 1982

[54] PARALLEL GENERATION OF SERIAL CYCLIC REDUNDANCY CHECK

[75] Inventors: Gary J. Goss, Acton; Robert C. Miller, Braintree, both of Mass.

[73] Assignee: Honeywell Information Systems Inc., Waltham, Mass.

[21] Appl. No.: 884,465

[22] Filed: Mar. 7, 1978

Related U.S. Application Data

[63] Continuation of Ser. No. 714,074, Aug. 12, 1976, abandoned.

[51] Int. Cl.³ ............................................. G06F 11/10
[52] U.S. Cl. ..................................... 371/37; 364/300; 364/900
[58] Field of Search ................. 340/146.1 AL; 371/37, 371/38, 39, 40; 364/200, 900, 300

[56] References Cited

PUBLICATIONS

Nicholson, Cyclic Redundancy Check System, IBM Technical Disclosure Bulletin, vol. 19, No. 9, Feb. 1977, pp. 3350–3351.
Dixon, Exclusive-OR Data Manipulation for Cyclic Code Generation, IBM Technical Disclosure Bulletin, vol. 14, No. 3, Aug. 1971, p. 857.
Vasa, Calculating an Error Checking Character in Software, Computer Design, May 1976, pp. 190–191.
Boudreau and Steen, Cyclic Redundancy Checking by Program, Fall Joint Computer Conference, 1971, pp. 9–15.
Hanover and Jaeger, Programmed Cyclic Redundancy Checking, IBM Technical Disclosure Bulletin, vol. 19, No. 8, Jan. 1977, p. 2867.
P. Bushnell, CRCC Calculation by Software, Electronic Engineering, Aug. 1976, vol. 48, No. 582, p. 17.

*Primary Examiner*—Charles E. Atkinson
*Attorney, Agent, or Firm*—George Grayson; Nicholas Prasinos

[57] ABSTRACT

A method and apparatus for assuring the accuracy of data received by any device in a computer system from any other device in the same computer system or from another computer system. The existing hardware of a computer system is utilized to generate a cyclic redundant check character each time a unit of data is transmitted. The cyclic redundant check character is concatenated to the right of such data transmitted. Each time that the particular data is received, the check character and the data with which it is associated, is again manipulated in the same manner as in generating the check character. If the data received is the same as the data transmitted, the result of such manipulation is zero.

26 Claims, 7 Drawing Figures

| | | | | | | | | | |
|---|---|---|---|---|---|---|---|---|---|
| ⓪ OLD RESIDUE IN SPM | 0 | 0 | 0 | $c_0$ | $c_1$ | $c_2$ | $c_3$ | $c_4$ | $c_5$ |
| Ⓑ NEW DATA IN ACC. | 0 | 0 | 0 | $d_0$ | $d_1$ | $d_2$ | $d_3$ | $d_4$ | $d_5$ |
| ① EXCLUSIVE OR TO AC | 0 | 0 | 0 | $c_0 \oplus d_0$ | $c_1 \oplus d_1$ | $c_2 \oplus d_2$ | $c_3 \oplus d_3$ | $c_4 \oplus d_4$ | $c_5 \oplus d_5$ |
| ①ⓐ STORE IN SPM | 0 | 0 | 0 | $c_0 \oplus d_0$ | $c_1 \oplus d_1$ | $c_2 \oplus d_2$ | $c_3 \oplus d_3$ | $c_4 \oplus d_4$ | $c_5 \oplus d_5$ |
| ② LSH AC | $c_0 \oplus d_0$ | $c_1 \oplus d_1$ | $c_2 \oplus d_2$ | $c_3 \oplus d_3$ | $c_4 \oplus d_4$ | $c_5 \oplus d_5$ | 0 | 0 | 0 |
| ③ EXCLUSIVE OR TO AC | $c_0 \oplus d_0$ | $c_1 \oplus d_1$ | $c_2 \oplus d_2$ | $c_0 \oplus d_0 \oplus c_3 \oplus d_3$ | $c_1 \oplus d_1 \oplus c_4 \oplus d_4$ | $c_2 \oplus d_2 \oplus c_5 \oplus d_5$ | $c_3 \oplus d_3$ | $c_4 \oplus d_4$ | $c_5 \oplus d_5$ |
| ④ AND AC WITH K=00011111 | 0 | 0 | 0 | $c_0 \oplus d_0 \oplus c_3 \oplus d_3$ | $c_1 \oplus d_1 \oplus c_4 \oplus d_4$ | $c_2 \oplus d_2 \oplus c_5 \oplus d_5$ | $c_3 \oplus d_3$ | $c_4 \oplus d_4$ | $c_5 \oplus d_5$ |
| ⑤ RRA(3) SAVE | $c_3 \oplus d_3$ | $c_4 \oplus d_4$ | $c_5 \oplus d_5$ | 0 | 0 | 0 | $c_0 \oplus d_0 \oplus c_3 \oplus d_3$ | $c_1 \oplus d_1 \oplus c_4 \oplus d_4$ | $c_2 \oplus d_2 \oplus c_5 \oplus d_5$ |
| ⑥ RRA(3) SAVE 2ND TIME | x | x | x | $c_3 \oplus d_3$ | $c_4 \oplus d_4$ | $c_5 \oplus d_5$ | 0 | 0 | 0 |
| ⑦ OR'ed | x | x | x | $c_3 \oplus d_3$ | $c_4 \oplus d_4$ | $c_5 \oplus d_5$ | $c_0 \oplus d_0 \oplus c_3 \oplus d_3$ | $c_1 \oplus d_1 \oplus c_4 \oplus d_4$ | $c_2 \oplus d_2 \oplus c_5 \oplus d_5$ |
| ⑧ AND AC. WITH K=00011111 | 0 | 0 | 0 | $c_3 \oplus d_3$ | $c_4 \oplus d_4$ | $c_5 \oplus d_5$ | $c_0 \oplus d_0 \oplus c_3 \oplus d_3$ | $c_4 \oplus d_4 \oplus c_3 \oplus d_3$ | $c_2 \oplus d_2 \oplus c_5 \oplus d_5$ |
| ⑨ STORE | 0 | 0 | 0 | $c_3 \oplus d_3$ | $c_4 \oplus d_4$ | $c_5 \oplus d_5$ | $c_0 \oplus d_0 \oplus c_3 \oplus d_3$ | $c_1 \oplus d_1 \oplus c_4 \oplus d_4$ | $c_2 \oplus d_2 \oplus c_5 \oplus d_5$ |

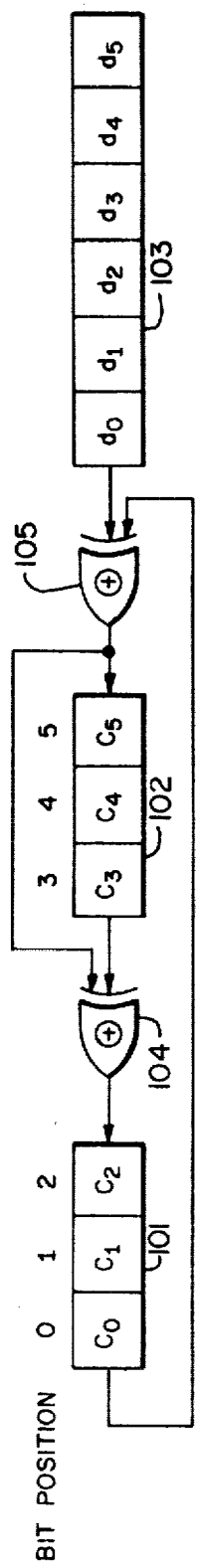

| BIT POSITION | $t_0$ | $t_1$ | $t_2$ | $t_3$ | $t_4$ | $t_5$ | $t_6$ |
|---|---|---|---|---|---|---|---|
| 0 | $c_0$ | $c_1$ | $c_2$ | $c_0 \oplus d_0 \oplus c_3$ | $c_1 \oplus d_1 \oplus c_4$ | $c_2 \oplus d_2 \oplus c_5$ | $c_3 \oplus d_3$ |
| 1 | $c_1$ | $c_2$ | $c_0 \oplus d_0 \oplus c_3$ | $c_1 \oplus d_1 \oplus c_4$ | $c_2 \oplus d_2 \oplus c_5$ | $c_3 \oplus d_3$ | $c_4 \oplus d_4$ |
| 2 | $c_2$ | $c_0 \oplus d_0 \oplus c_3$ | $c_1 \oplus d_1 \oplus c_4$ | $c_2 \oplus d_2 \oplus c_5$ | $c_0 \oplus d_0 \oplus c_3 \oplus d_3 \oplus c_0 \oplus d_0$ | $c_4 \oplus d_4$ | $c_5 \oplus d_5$ |
| 3 | $c_3$ | $c_4$ | $c_5$ | $c_0 \oplus d_0$ | $c_1 \oplus d_1$ | $c_2 \oplus d_2$ | $c_0 \oplus d_0 \oplus c_3 \oplus d_3$ |
| 4 | $c_4$ | $c_5$ | $c_0 \oplus d_0$ | $c_1 \oplus d_1$ | $c_2 \oplus d_2$ | $c_0 \oplus d_0 \oplus c_3 \oplus d_3$ | $c_1 \oplus d_1 \oplus c_4 \oplus d_4$ |
| 5 | $c_5$ | $c_0 \oplus d_0$ | $c_1 \oplus d_1$ | $c_2 \oplus d_2$ | $c_0 \oplus d_0 \oplus c_3 \oplus d_3$ | $c_1 \oplus d_1 \oplus c_4 \oplus d_4$ | $c_2 \oplus d_2 \oplus c_5 \oplus d_5$ |

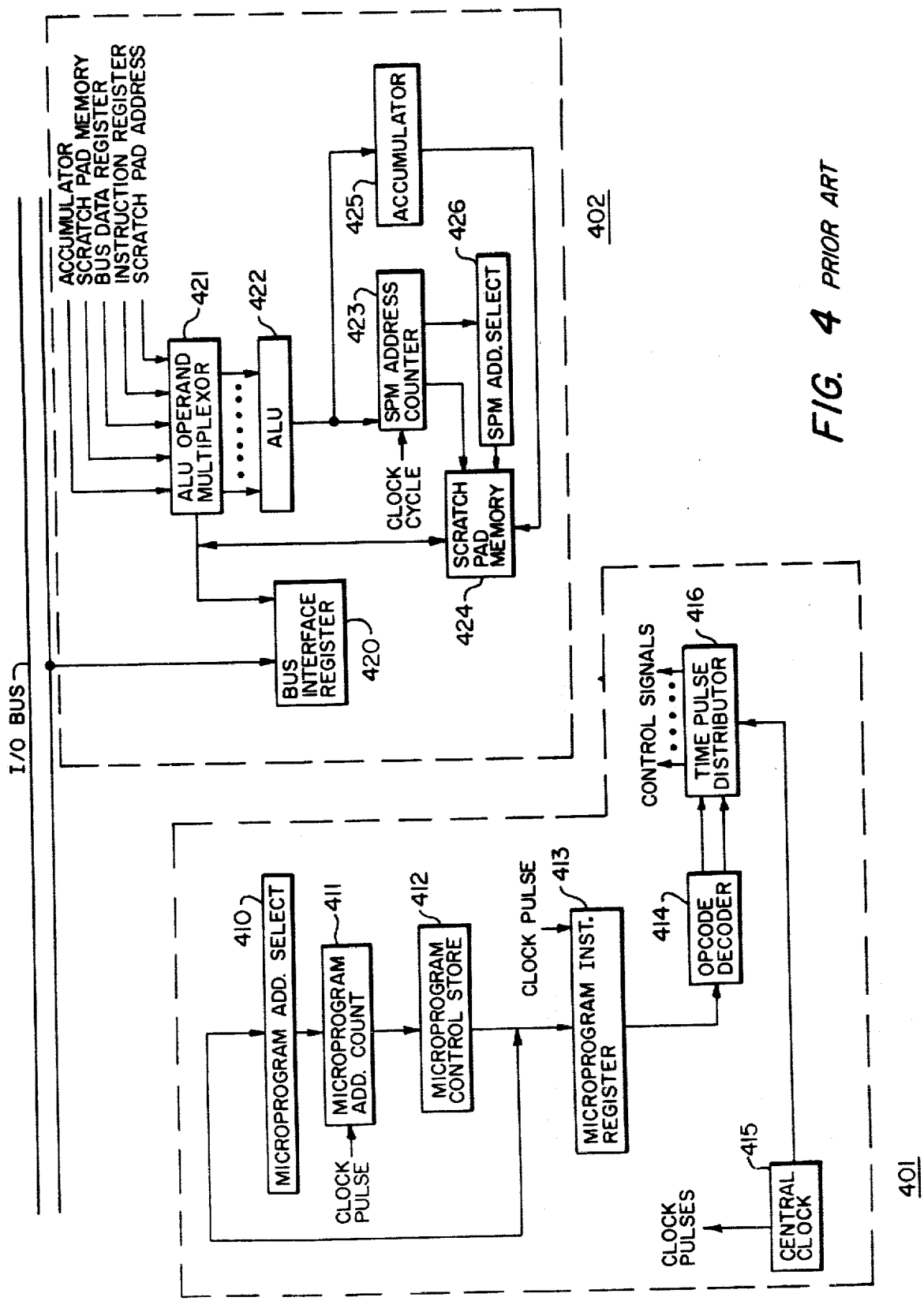
F/G. 4 PRIOR ART

| | | | | $c_0$ | $c_1$ | $c_2$ | $c_3$ | $c_4$ | $c_5$ |
|---|---|---|---|---|---|---|---|---|---|
| ⓪ OLD RESIDUE IN SPM | 0 | 0 | 0 | $d_0$ | $d_1$ | $d_2$ | $d_3$ | $d_4$ | $d_5$ |
| ⑧ NEW DATA IN ACC. | 0 | 0 | 0 | $c_0 \oplus d_0$ | $c_1 \oplus d_1$ | $c_2 \oplus d_2$ | $c_3 \oplus d_3$ | $c_4 \oplus d_4$ | $c_5 \oplus d_5$ |
| ① EXCLUSIVE OR TO AC | 0 | 0 | 0 | $c_0 \oplus d_0$ | $c_1 \oplus d_1$ | $c_2 \oplus d_2$ | $c_3 \oplus d_3$ | $c_4 \oplus d_4$ | $c_5 \oplus d_5$ |
| ⑩ STORE IN SPM | 0 | 0 | 0 | $c_3 \oplus d_3$ | $c_4 \oplus d_4$ | $c_5 \oplus d_5$ | 0 | 0 | 0 |
| ② LSH AC | $c_0 \oplus d_0$ | $c_1 \oplus d_1$ | $c_2 \oplus d_2$ | $c_0 \oplus d_0$ $c_3 \oplus d_3$ | $c_1 \oplus d_1$ $c_4 \oplus d_4$ | $c_2 \oplus d_2$ $c_5 \oplus d_5$ | $c_3 \oplus d_3$ | $c_4 \oplus d_4$ | $c_5 \oplus d_5$ |
| ③ EXCLUSIVE OR TO AC. | $c_0 \oplus d_0$ | $c_1 \oplus d_1$ | $c_2 \oplus d_2$ | $c_0 \oplus d_0$ $c_3 \oplus d_3$ | $c_1 \oplus d_1$ $c_4 \oplus d_4$ | $c_2 \oplus d_2$ $c_5 \oplus d_5$ | $c_3 \oplus d_3$ | $c_4 \oplus d_4$ | $c_5 \oplus d_5$ |
| ④ AND AC. WITH K=000111111 | $c_3 \oplus d_3$ | $c_4 \oplus d_4$ | $c_5 \oplus d_5$ | 0 | 0 | 0 | $c_3 \oplus d_3$ | $c_4 \oplus d_4$ | $c_5 \oplus d_5$ |
| ⑤ RRA(3) SAVE | x | x | x | $c_3 \oplus d_3$ | $c_4 \oplus d_4$ | $c_5 \oplus d_5$ | 0 | 0 | 0 |
| ⑥ RRA(3) SAVE 2ND TIME | x | x | x | $c_3 \oplus d_3$ | $c_4 \oplus d_4$ | $c_5 \oplus d_5$ | $c_0 \oplus d_0$ $c_3 \oplus d_3$ | $c_1 \oplus d_1$ $c_4 \oplus d_4$ | $c_2 \oplus d_2$ $c_5 \oplus d_5$ |
| ⑦ OR'ed | 0 | 0 | 0 | $c_3 \oplus d_3$ | $c_4 \oplus d_4$ | $c_5 \oplus d_5$ | $c_0 \oplus d_0$ $c_3 \oplus d_3$ | $c_1 \oplus d_1$ $c_4 \oplus d_4$ | $c_2 \oplus d_2$ $c_5 \oplus d_5$ |
| ⑧ AND AC. WITH K=000111111 | 0 | 0 | 0 | $c_3 \oplus d_3$ | $c_4 \oplus d_4$ | $c_5 \oplus d_5$ | $c_0 \oplus d_0$ $c_3 \oplus d_3$ | $c_1 \oplus d_1$ $c_4 \oplus d_4$ | $c_2 \oplus d_2$ $c_5 \oplus d_5$ |
| ⑨ STORE | 0 | 0 | 0 | $c_3 \oplus d_3$ | $c_4 \oplus d_4$ | $c_5 \oplus d_5$ | $c_0 \oplus d_0$ $c_3 \oplus d_3$ | $c_1 \oplus d_1$ $c_4 \oplus d_4$ | $c_2 \oplus d_2$ $c_5 \oplus d_5$ |

FIG. 5

PARALLEL GENERATION OF SERIAL CYCLIC REDUNDANCY CHECK

This is a continuation of application Ser. No. 714,074, filed Aug. 12, 1976 and now abandoned.

BACKGROUND OF THE INVENTION

1. Field of the Invention

This invention relates to computer systems and telecommunication systems utilizing computers and more particularly to a method and apparatus for manipulating data to generate a cyclic redundancy check character, and for utilizing the cyclic redundancy check character generated and the data which it represents to ascertain that the data has not been altered.

2. Description of the Prior Art

A variety of different forms of error detection are built into data handling equipment. Such error detecting apparatus assume particular importance when data is transmitted from one particular device to another device within a data processing system or from one data processing system to another, where the probability of losing or obliterating several sequential bits is greater due to noise in transmission. Of course, changing even one bit would change the sense of an entire message.

Several schemes and devices have been utilized in error control. Perhaps the most common method of detecting errors is the use of parity. With this method, the digits of a binary word are inspected and an extra digit or bit (binary-digit) is added. This digit is chosen to be "zero" or "one", as necessary to keep the total number of digits in the "one" state either odd or even according to a predetermined convention. Another single-error correcting code is the Hamming code where parity checked digits are assigned to particular positions where their weights indicate which digits of the whole code are in error. Still other techniques utilize sum checks.

When information is transmitted through data links using public telephone networks or other such communication devices, the type of error encountered is different from those previously considered. Because the digits are transmitted serially, impulsive noise from the communication channel affects a sequence of adjacent digits as well. One technique utilizes a cyclic redundant check character for detecting such errors. In this technique a finite length of an original sequence of characters is divided by an operator to produce a remainder; the actual transmission comprises the original sequence followed by the remainder. At the receiver, a similar division process produces a locally generated remainder for comparison with that sent by the transmitter. Any differences result from the introduction of error sequences which cannot be divided exactly by the chosen operator.

In implementing this technique additional hardware is required both at the transmitting and receiving end. This hardware usually takes the form of an additional shift register, exclusive OR circuits and comparator. Since computer networks, where one computer system communicates with another, are beginning to mushroom, and since not all computer systems are equipped with this additional hardware, universal checking for transmission errors via this technique is not feasible unless the existing hardware of each existing computer system can be utilized to implement this technique.

One way of utilizing existing hardware is to provide software techniques that utilize a program for manipulation of the data to generate the character. However, such a scheme is too slow to keep up with the rate of transmission or reception and of utilization of modern-day data communication systems. What is needed is a control means and/or method for utilizing existing computer hardware at a rate greater than or equal to the rate of transmission or reception in generating and utilizing a cyclic redundant check character. Moreover, such control means and/or method should not require additional hardware, and should require only a modicum of modification to any computer system.

OBJECTS OF THE INVENTION

It is a primary object of the invention therefore to provide an improved error control system for a computer system.

It is another object of the invention to provide an improved error control system for a communication channel utilized by two or more computer systems.

It is still a further object of the invention to provide an improved error control system for computers utilized in a computer network.

Still another object of the invention is to provide an improved error control system for a computer network system utilizing existing hardware of the network system.

A more specific object of the invention is to provide an improved error control system which generates and utilizes a cyclic redundant check character similar to that generated by prior art equipment but not requiring additional hardware as in prior art equipment.

SUMMARY OF THE INVENTION

In accordance with the above and other objects of the invention, there is provided a method and apparatus for assuring the accuracy of data received by any device in a computer system from any other device in the same computer system or from another computer system. The existing hardware of a computer system is utilized to generate a cyclic redundant check character each time a unit of data is transmitted. This is accomplished by microprogramming the Read Only Memory (ROM) of a computer system to control the existing arithmetic logic unit (ALU) and accumulator (AC) together with the scratchpad memory (SPM) of a computer system to generate and utilize a cyclic redundant check character. The check character is concatenated to the right of a unit of data and is transmitted along with the unit of data with which it is associated. A device receiving the unit of data together with its check character manipulates them in the same manner as in generating the check character utilizing its own SPM, AC and ROM microprogrammed in the same manner as in generating the cyclic redundancy check character. If the data received is the same as the data transmitted, the result of such manipulation is zero.

The device receiving the unit of data together with its check character in accordance with the teachings of the invention sends the unit of data with its check character back to the sending device. There the same apparatus that generated the check character, manipulates the received unit of data and its check character. When the result of this manipulation is zero, then the indication is that there were no errors in transmitting the unit of data with its check character. The arrangement of the invention enables the sending device to start receiving portions of the unit of data for checking while it is sending the remainder of the unit of data with the check character. The apparatus in the sending device generates the check character which is appended to the unit of data to be transmitted. At the same time, the same apparatus receives the unit of data being read back from the receiving device and generates a check character which is checked against the check character read back.

Thus the same apparatus in the device that generates the cyclic redundant check character is also used to check a unit of data received as a result of a read operation.

BRIEF DESCRIPTION OF THE DRAWINGS

FIG. 1 is the prior art apparatus for generating and utilizing the cyclic redundant check character of the invention.

FIG. 2 are the states of the device of FIG. 1 at various times t.

FIG. 4 is a portion of a prior art computer system utilized to practice the invention.

FIG. 5 is the microprogram for microprogramming the control store and the various state of the bit character as a result of each step.

DESCRIPTION OF THE PREFERRED EMBODIMENT OF THE INVENTION

General

Figures 3, 6:
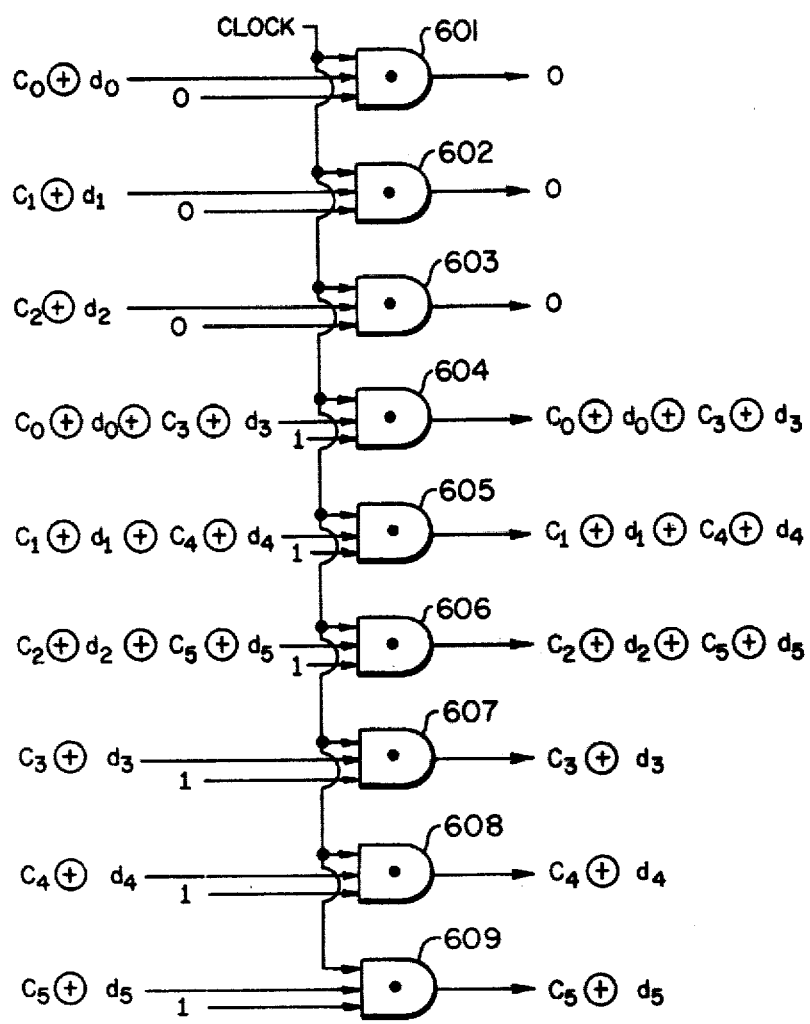
FIG. 3 is an intermediate arrangement of the bits utilized in generating the cyclic redundant check character of the invention.
FIG. 6 shows the hardware for providing AND operations for an alternate embodiment of the invention.
Figure 7:
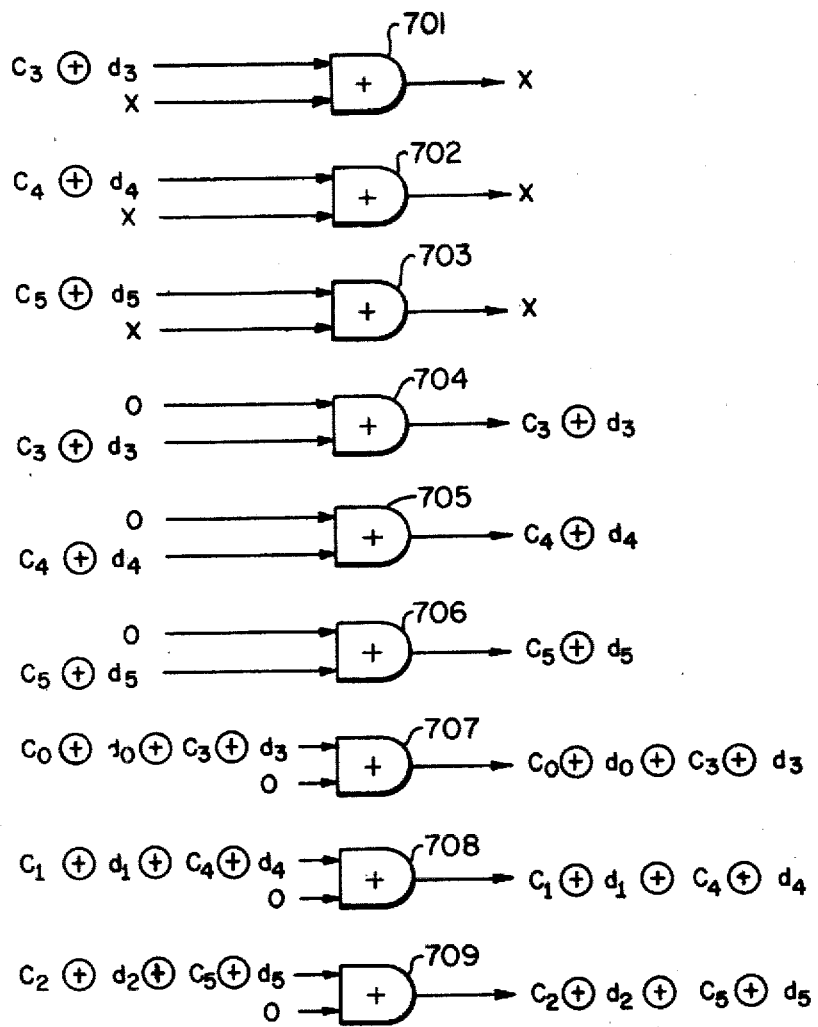
FIG. 7 shows the hardware for providing OR operations for an alternate embodiment of the invention.

Since the invention performs the same functions of generating a cyclic redundant check character and utilizing it as do prior art apparatus added to a computer system, but does not require any additional hardware to be added to a computer system other than that already present in most prior art computer systems, it would be helpful in understanding the invention, to further discuss in greater detail the prior art hardware specifically utilized for generating the cyclic redundant check character. Moreover, it is desirable to discuss the prior art hardware existing in most computer systems such as the arithmetic and logic unit (ALU), accumulator and scratchpad memory which does not generate or utilize a cyclic redundant character, but can be modified by microprogramming the control store or ROM, to control the ALU, accumulator and scratchpad memory so that these elements cooperate and function with each other to generate and utilize the cyclic redundant check character for error control.

Referring, therefore, to FIG. 1 there is shown prior art shift registers 101, 102 and 103. Shift register 103 stores and shifts a unit of data comprised of 6 bits $d_0$ through $d_5$. (It should be understood that any number of bits may be utilized as a unit of data). Shift register 101 stores half a unit of data comprised of 3 bits $C_0$ through $C_2$ whereas shift register 102 stores the other half of a unit of data comprised of 3 bits $C_3$–$C_5$. Between shift register 101 and 102 there is an exclusive OR circuit 104 coupling the two shift register together; and between shift registers 102 and 103 there is an exclusive OR circuit 104 coupling those two shift registers together. Moreover, the output of exclusive OR circuit 105 is applied to exclusive OR circuit 104 and the data signal in the first bit position of shift register 101 is applied to exclusive OR circuit 105. The result of serially shifting each bit from right to left through the various bit positions of registers 101, 102 at different times $t_0$–$t_6$ is shown in FIG. 2. Referring to FIG. 2 it will be seen that at time $t_0$ a bit $C_0$ is stored at bit position 0 of shift register 101; at bit position 1, a bit $C_1$ is stored; at bit position 2, a bit $C_2$ is stored; at bit position 3, a bit $C_3$ is stored; at bit position 4, a bit $C_4$ is stored; whereas at bit position 5, a bit $C_5$ is stored. At the next time interval $t_1$ all bits shift to the left and in doing so certain of the bits are exclusive OR'ed. Hence at time interval $t_1$ bit $C_1$ is stored at bit position 0; at bit position 1, bit $C_2$ is stored; at bit position 2 the exclusive OR addition or the modulo 2 sum of bits 0, 3 and the first bit of register 103 is stored resulting in the exclusive OR'ed character $C_0$, exclusive OR'ed to $d_0$ which in turn is exclusive OR'ed to $C_3$; at bit position 3 the bit $C_4$ is stored; at bit position 4 the bit $C_5$ is stored; and at bit position 5 the modulo 2 sum of bit $C_0$ and $d_0$ is stored. At the next time interval $t_2$ there is a shift of all bits to the left again with certain of the bits being exclusive OR'ed as indicated in the column under $t_2$. This procedure is repeated until at time period $t_6$ the shift registers 101 and 102 contain the cyclic redundant check character shown in column $t_6$ of FIG. 2, which is appended to the unit of data (in this example comprising 6 bits) for which the cyclic redundant check character was generated. The unit of data (i.e. the 6 bit character) and the concatenated cyclic redundant check character are then stored for further use or used immediately or transmitted to another portion of the computer system or to another computer system. Upon receipt of this unit of data and its appended cyclic redundant check character, the apparatus of FIG. 1 would again be utilized in the same manner and in the same sequence whereupon at time interval $t_6$ there is a 0 result if all the bits of the received unit of data are correct and have not been altered in the transmission process. Hence the same apparatus is utilized both in generating and in utilizing the cyclic redundant check character. The cyclic redundant check character in the diagram of FIG. 2 is the result of all the modulo 2 operations represented under column $t_6$. It can readily be appreciated that in order for this system to be implemented, each transmitting and receiving computer system must be equipped with the hardware of FIG. 1. This means additional cost in material and labor. However, since most computer systems are equipped with prior art hardware as shown on FIGS. 4, 5, 6 and 7, the instant invention produces the same cyclic redundant check character as that produced under column $t_6$ by merely utilizing the prior art hardware of FIGS. 4, 5, 6 and 7 in a new and unobvious manner by generating firmware via microprogramming the microprogram control unit. The term firmware is used herein as defined by Sippl and Sippl on page 186 of "Computer Dictionary and Handbook" i.e. logic circuits in read-only memory that may be altered by the software under certain circumstances. This firmware then becomes a permanent additional function of the old computer system providing it with additional capability it did not possess previously. Generating firmware via microprogramming techniques is well known in the computer art and is described in a book entitled "Microprogramming Handbook" second edition, published by Micro Data Corporation, 644 East Young Street, Santa Anna, Cal. and also a book entitled "Microprogramming: Principles and Practices" by Samir S. Husson, published by Prentice-Hall Inc., Englewood Cliffs, N.J.

Referring to FIG. 4, a portion of a prior art microprogrammed computer which is utilized by the invention is shown. Morever, such well known computer systems as the Honeywell Series 60, and the IBM Series 360 and 370 may be utilized to practice the invention. Referring to FIG. 4 there is shown a microprogram control store 412 which for this particular computer is 16 bits wide, although any other length may be utilized, and is expandable to a maximum of 4,000 words. This amount of addressability is sufficient to permit the practice of the instant invention. The output of the microprogram control store 412 is clocked into the microprogram instruction register 413 at the leading edge of each clock cycle generated by central clock 415. Additionally, the microprogram address counter 411 is advanced at the leading edge of every clock cycle to indicate the new address. Thus, as one microinstruction is stored in the microprogram instruction register 413 for execution, the microprogram address counter 411 changes to access the next microinstruction by incrementing by one. When a branch command is executed, however, the increment function of microprogram address counter 411 is inhibited by techniques well known in the computer art and the microprogram instruction register 413 is loaded with the output of the microprogram address selector 410. As previously noted, the output of control store 412 is stored in instruction register 413 for execution. The 3 high order bits of each microinstruction are coded to indicate the type of command and comprise the op-code of the microinstruction. The op-code decoder 414 decodes the 3 high order bits of the instruction register and applies the output to a time pulse distributor 416 which in turn distributes control pulses to various hardware units to control hardware operations. A more detailed description of microprogrammed control units equivalent to microprogram control unit 401 described supra may be found in the above referenced books. Moreover, typical microprogrammed control units are disclosed in U.S. Pat. Nos. 3,380,025 issued Apr. 23, 1968; and in U.S. Pat. No. 3,955,180 issued May 4, 1976.

The unit denoted by the reference numeral 402 shows in block diagram format the arithmetic logic unit 422, scratchpad memory 424 and accumulator 425 controlled by the control signals generated by control unit 401. Information from the accumulator, scratchpad memory, bus interface register 420 and instruction register is applied to the arithmetic logic unit ALU 422 by means of multiplexer 421 which selects among others one of these registers. The arithmetic and logic unit performs arithmetic and logic operations depending on the coding of the microinstruction in microprogram instruction register 413 being executed. The accumulator 425 is a 9-bit register which is used for temporary storage of the output of the ALU 422. Additionally, the contents of the accumulator can be right rotated one bit position while left shift operations can be performed by the ALU 422. (Arithmetic logic units and accumulators are well known in the prior art, some typical ones being disclosed in U.S. Pat. Nos. 3,404,378 issued on Oct. 1, 1968 and in 3,238,508 issued Mar. 1, 1966. Also, multiplexers are well known and commercially available from such companies as Texas Instruments Inc., of Dallas, Tex. See pages 9-339 through 9-364 of the Integrated Circuits Catalog for Design Engineers, published by Texas Instruments of Dallas, Tex. for description and availability of data selectors, and data multiplexers). The scratchpad memory 424 of the prior art system being described herein is comprised of 256 9-bit words for storing data, status commands, etc., although any other word size or quantity may be utilized. Typical scratchpad memories are disclosed in U.S. Pat. Nos. 3,248,708 issued Apr. 26, 1966 and in 3,351,909 issued Nov. 7, 1967. Data may be written into scratchpad memory 424 from the ALU operand multiplexor 421 which permits any visible register to serve as an input local register. Data out from the scratchpad memory 424 is applied to the ALU operand multiplexer 421. An 8 bit SPM address counter 423 is loaded with the result of an ALU operation and can be incremented at each clock cycle. The output of the SPM address counter is applied to the ALU operand multiplexer 421; moreover, SPM address counter 426 is also utilized to address the scratchpad memory 424. The central clock 415 is an 8 MHZ crystal oscillator which is divided to obtain a 250 ns clock cycle. The clock cycles developed from the central clock 415 are then distributed to the various elements of FIG. 4. Crystal oscillators for providing clock cycles are well known in the prior art. (Typical computer timing and control systems are shown in U.S. Pat. Nos. 3,254,329 issued May 31, 1966 and in U.S. Pat. No. 3,417,379 issued Dec. 17, 1968.

Detailed Description and Operation of the Invention

Referring now to FIG. 3, FIG. 5 and page 130 of the Appendix, a detailed description and operation of the invention is presented. It should be noted that one of the objects of the invention is to obtain the results in column $t_6$ of FIG. 2 without utilizing the additional prior art hardware of FIG. 1. Accordingly, one of the first objectives of the firmware control of the invention is to arrange the various bits of a word being received in a definite pattern relative to the bits of the previous word received. Inspection of column $t_6$ shows that the first bit in each row of that column has a particular sequence which is also shown in row 1, of FIG. 3. Similarly, the sequence of bits in columns 2, 3 and 4 within column $t_6$ of FIG. 2 are shown in rows 2, 3 and 4 respectively of FIG. 3. By exclusive OR'ing the data contained in the bit positions of various rows of FIG. 3, the result desired is obtained. How this is performed by the firmware is shown and described in FIG. 5 and page 130 of the Appendix.

Referring to page 130 of the Appendix beginning at line 41214.000 there is shown the microprogram of the invention. FIG. 5 repeats this microprogram and shows the results of each step. Referring now once again to FIG. 5, row $\alpha$ shows the old residue in scratchpad memory 424 as a result of the previous manipulation in obtaining the cyclic redundant check character. Row $\beta$ shows the new data which has been received in the accumulator 425. On step number 1, the old residue is exclusive OR'ed bit by bit by the arithmetic and logic unit ALU with the new data in the arithmetic and logic unit ALU 422 and the result is temporarily stored in the accumulator. In step 1(a), the results stored in the accumulator 425 are transferred and stored in a predetermined location in scratchpad memory 424; moreover the result in the accumulator is also left shifted 3 bits so that zeroes occupy the first 3 bit positions of the accumulator. In step number 3 the left shifted result of the accumulator is exclusive OR'ed with the previously stored results of step 1(a) in scratchpad memory and temporarily stored in the accumulator. Once again the ALU is utilized for this operation. In step number 4 each bit in the accumulator is AND'ed with one bit of the constant K=000111111. This operation is performed in the ALU 422. However, an alternative embodiment is shown in FIG. 6. Three inputs are applied to each AND gate 601-609. One input for each AND gate is one digit respectively of the constant K=000111111; another input of each AND gate is the signal stored in a respective bit position of the accumulator; finally a clock pulse is applied as another input to each AND gate 601-609 to enable each gate; thus giving the results at the output of each AND gate. This result is temporarily stored in the accumulator. In step number 5 the accumulator is right rotated 3 bits and the result saved in a predetermined address in the scratchpad memory 424. Another right rotation of the accumulator is performed in step 6. It should be noted that the first 3 bit positions of the accumulator store a quantity which is meaningless in step 6, and is denoted in FIG. 5 by the symbol X. In step number 7 the right rotated result stored in the accumulator is OR'ed with the value saved in scratchpad memory 424 in step 5. This is done in the preferred embodiment by the ALU 422. An alternative apparatus for doing this is shown on FIG. 7. To each OR gate 701-709 there is applied 2 inputs, one input on each OR gate from a respective bit of the resulting bits of data saved in the scratchpad memory 424 and another input on each gate respectively from a respective bit of the resulting bits of data stored in the accumulator 425. Accordingly, on OR gates 701, 702 and 703 a meaningless output signal denoted by the letter X is obtained at each output terminal. On OR gates 704-709 where a respective input is OR'ed with zero the output of each gate is merely the other input of the respective OR gate. These outputs of OR gates 701-709 are temporarily stored in accumulator 425. In step number 8 each bit of the accumulator is once again AND'ed with each bit respectively of the constant K=000111111 as previously described supra. Finally, step number 9 stores the result of the accumulator in a predetermined position in scratchpad memory as a residue and is the cyclic redundant check character for the word just received. It should be noted by comparing the last row of FIG. 5 with the last column $t_6$ of FIG. 2 that the results are identical. This has been accomplished by utilizing existing hardware in the computer system by microprogramming the microprogrammed control unit to produce the firmware herein. Accordingly, not only has the invention produced a new combination and a new use of an old machine but a synergistic result as well, since the computer system has been given additional capability by utilizing the old elements of the computer to perform in a manner which is greater than the sum of its parts i.e. do something the old elements could not do singly or in combination.

As previously noted, the Appendix is a listing of the microprograms of the control unit which act as background information in practicing the invention. In correlating page 130 of the Appendix, it should be noted on line 41218.000 that the letters I and J have been substituted for $C_0 \oplus d_0$, $C_1 \oplus d_1$, $C_2 \oplus d_2$ and $C_3 \oplus d_3$, $C_4 \oplus d_4$, $C_5 \oplus d_5$ respectively. Pages 1-8 control the formatting information of the control store. Pages 9-30 initialize the prior art hardware of FIG. 4; pages 33-68 is firmware common to all devices of the computer system. Pages 69-79 is firmware for the console not shown; pages 80-95 is firmware for the card reader also not shown; pages 96-102 is firmware for the test and diagnostic channel with page 130 being the firmware for this particular invention.

We claim:

1. The method of generating a cyclic redundant check character in a general purpose computer comprising:
    (a) generating a first result by exclusive OR'ing with a previously generated cyclic redundant check character, the new data for which a cyclic redundant check character is to be generated;
    (b) left shifting the first result by a predetermined number of bits;
    (c) generating a second result by exclusive OR'ing the unshifted first result with the left shifted first result;
    (d) generating a third result by AND'ing each bit of the second result with a respective bit in a predetermined constant;
    (e) generating a fourth result by right rotating the third result by a predetermined number of bits;
    (f) generating a fifth result by right rotating the fourth result;
    (g) generating a sixth result by OR'ing the fourth result with the sixth result;
    (h) generating a seventh result by AND'ing each bit respectively of the sixth result with a respective bit of a predetermined constant whereby the new cyclic redundant check character is generated.

2. The method as recited in claim 1 wherein said predetermined number of bits in step (b) is 3.

3. The method as recited in claim 2 wherein said predetermined number of bits in step (e) is 3.

4. The method as recited in claim 3 wherein the constant in step (d) is 000111111.

5. The method as recited in claim 4 wherein the constant in step (h) is 000111111.

6. In a general purpose computer comprising at least a microprogrammed control unit, arithmetic and logic unit, accumulator, scratch pad memory, and registers coupled for communicating with each other via an input/output bus, a method of generating a cycle redundant check character comprising the steps of:
    (a) storing in said scratch pad memory a first cyclic redundant check character calculated in previous operations i.e. old residue;
    (b) storing in said accumulator new data received;
    (c) exclusive OR'ing in said arithmetic and logic unit the old residue with the new data thus generating a first result;
    (d) storing said first result in accumulator;
    (e) additionally storing said first result in said scratch pad memory;
    (f) left shifting the first result in said accumulator by 3 bits;
    (g) exclusive OR'ing in said arithmetic and logic unit the left shifted first result stored in said accumulator with the unshifted first result stored in said scratch pad memory thus generating a second result;
    (h) storing the second result in said accumulator;
    (i) AND'ing each bit of the second result with each bit respectively on a bit for bit basis with a predetermined constant thus generating a third result;
    (j) storing the third result in said accumulator;
    (k) right rotating the third result in said accumulator by 3 bits thus generating a fourth result;
    (l) storing said fourth result in scratch pad memory;

(m) right rotating the fourth result in the accumulator; thus generating a fifth result;
(n) OR'ing the right rotated fifth result in said accumulator with the fourth result in scratch pad memory thus generating a sixth result;
(o) storing said sixth result in said scratch pad memory; and,
(p) AND'ing each bit of said fifth result with each bit respectively on a one for one basis with a predetermined constant.

7. The steps as recited in claim 6 wherein the constant in said step (i) is 000111111.

8. The steps as recited in claim 7 wherein the constant in said step (p) is 000111111.

9. A method for controlling a general purpose computer which facilitates the generation of a cyclic redundant check (CRC) character for checking the transmission and/or reception of blocks of data to and from a storage device, comprising an arithmetic and logic unit (ALU), an accumulator coupled to said ALU, an addressable scratchpad memory coupled to said ALU and to said accumulator, said scratchpad memory having a plurality of storage locations, a bus data register coupled to said ALU for storing data words sequentially for application to said ALU, and a microprogrammed processing unit including a cycled addressable control store including a plurality of storage locations for storing a corresponding number of microinstruction words, a first group of said locations including a predetermined sequence of microinstruction words, decoder circuits coupled to said control store, said decoder circuits being operatively coupled to said ALU, said accumulator and to said scratchpad memory for generating signals for controlling the operation of said computer during a cycle of operation, said method comprising the steps of:

(a) initially storing in a first memory location of said scratchpad memory, coded signals representative of a predetermined constant value;
(b) storing in a second scratchpad memory location, a CRC residue character generated from a previous cycle of operation stored in said accumulator;
(c) conditioning said ALU for transferring a first data word to said accumulator from said data register received from said device;
(d) generating a second data word for storage in said accumulator by said ALU exclusive ORing said first data word contents of said accumulator with said CRC residue character read out from said second scratchpad location in response to signals generated by said decoder circuit upon the readout of a first one of said microinstruction words of said sequence;
(e) transferring signals representative of said second data word stored in said accumulator to said second scratchpad memory location, in response to signals generated by said decoder circuit upon the readout of a second one of said microinstruction words of said sequence;
(f) generating a third data word by said ALU shifting said second data word contents of said accumulator left a predetermined number of bits in said ALU in response to signals generated by said decoder circuit upon the readout of a third one of said microinstruction words of said sequence;
(g) exclusive ORing said third data word accumulator contents with said second data word readout from said second scratchpad memory location by said ALU to produce a fourth data word in said accumulator in response to signals generated by said decoder circuit upon the readout of a fourth one of said microinstruction words of said sequence;
(h) ANDing said fourth data word accumulator contents with said predetermined constant readout from said first scratchpad memory location by said ALU for storage of said accumulator of a fifth data word in response to signals generated by said decoder circuit upon the readout of a fifth one of said microinstruction words of said sequence;
(i) generating a sixth data word for storage in said second scratchpad memory location by said accumulator rotating said fifth data word contents of said accumulator right a predetermined number of bits in response to signals generated by said decoder circuit upon the readout of a sixth one of said microinstruction words of said sequence;
(j) generating a seventh data word by said accumulator rotating said sixth data word contents of said accumulator right a predetermined number of bits in response to signals generated by said decoder circuit upon the readout of a seventh one of said microinstruction word of said sequence;
(k) generating an eighth data word for storage in said accumulator by said ALU exclusive ORing said seventh data word contents of said accumulator with said sixth data word readout from said second scratchpad location in response to signals generated by said decoder circuit upon the readout of a seventh one of said microinstruction word of said sequence;
(l) ANDing said eighth data word accumulator contents with said predetermined constant readout from said first scratchpad memory location by said ALU for storage of said accumulator of a ninth data word representative of a CRC residue character in response to signals generated by said decoder circuit upon readout of an eighth one of said microinstruction words of said sequence; and,
(m) transferring said CRC residue character from said accumulator to said second scratchpad memory location in response to signals generated by said decoder circuit in response to a ninth one of said microinstruction words of said sequence.

10. The method as recited in claim 9 wherein steps (c) through (m) are repeated a predetermined number of said cycles of operation after which said CRC residue character corresponds to said CRC character.

11. The method as recited in claim 10 wherein said method further includes the step of checking to verify that said CRC character has a value equal to zero after said predetermined number of said cycles of operation.

12. The method as recited in claim 9 wherein said predetermined number of bits in step (f) is 3.

13. The method as recited in claim 12 wherein said predetermined number of bits in step (j) is 3.

14. The method as recited in claim 13 wherein the constant in step (h) is coded to have a value of 000 111 111.

15. The method as recited in claim 14 wherein the constant in step (l) is coded to have a value of 000 111 111.

16. Computer apparatus for facilitating the generation of a cyclic redundant check (CRC) character for checking the transmission and reception of data words of a block to and from a storage device during the sequential transfer of a number of units of data, each unit having a plurality of bits, said apparatus comprising:

arithmetic and logic circuit means for performing logic and arithmetic operations;

accumulator means coupled to said arithmetic and logic circuit means for providing temporary storage of the results produced by said arithmetic and logic circuit (ALU) means;

an addressable scratchpad memory coupled to said arithmetic and logic circuit means and to said accumulator means, said memory including a plurality of storage locations for storing data words and a predetermined constant value;

a bus data register coupled to said arithmetic and logic circuit means for receiving each of said data words sequentially for application to said arithmetic and logic circuit means;

a microprogrammed processing unit including:

a cycled addressable control store including a plurality of storage locations for storing a corresponding number of microinstruction words, a first group of said locations storing a predetermined sequence of microinstruction words coded for generating said CRC character;

decoder circuit for generating signals for controlling the operation of said computer during a cycle of operation, coupled to said control store, said decoder circuit being operatively coupled to said arithmetic and logic circuit means, to said accumulator means and to said scratchpad memory;

said scratchpad memory being conditioned for initially storing in a first memory location, coded signals representative of a predetermined constant value, and storing in a second memory location, said CRC residue character generated from a previous cycle of operation;

said data register being conditioned for storing a first data word and transferring said first data word to said accumulator means;

said ALU means being operative during a first cycle of operation for exclusive ORing said first data word with said CRC residue character to generate a second data word in said accumulator means in response to signals generated by said decoder circuit upon readout of a first microinstruction word of said sequence from said control store;

said second scratchpad memory location being operative during a second cycle of operation for storing said second data word in response to signals generated upon readout of a second microinstruction word of said sequence from said control store;

said ALU means being operative during a third cycle of operation for shifting said second data word left a predetermined number of bits to generate a third data word in said accumul:tor means in response to signals generated upon readout of a third microinstruction word of said sequence from said control store;

said ALU means being operative during a fourth cycle of operation for exclusive ORing said third data word with said second word in said second scratchpad memory location to generate a fourth data word in said accumulator means in response to signals generated upon readout of a fourth microinstruction word of said sequence from said control store;

said ALU means being operative during a fifth cycle of operation for ANDing said fourth data word in said accumulator means with said predetermined constant value readout from said scratchpad memory to generate a fifth data word in said accumulator means in response to signals generated upon readout of a fifth microinstruction word of said sequence from said control store;

said accumulator means being operative during a sixth cycle of operation for rotating said fifth data word right a predetermined number of bits to generate a sixth data word in said accumulator means and said scratchpad memory being conditioned to receive said sixth data word in response to signals generated upon readout of a sixth microinstruction word of said sequence from said control store;

said accumulator means being operative during a seventh cycle of operation for rotating said sixth data word right a predetermined number of bits to generate a seventh data word in said accumulator means in response to signals generated upon readout of a seventh microinstruction word of said sequence from said control store;

said ALU means being operative during an eighth cycle of operation of exclusive ORing said seventh data word in said accumulator means with said sixth data word in said scratchpad memory to generate an eighth data word in said accumulator in response to signals generated upon readout of an eighth microinstruction word of said sequence from said control store;

said ALU means being operative during a ninth cycle of operation for ANDing said eighth data word in said accumulator means with said predetermined constant value readout from said scratchpad memory to generate a ninth data word in said accumulator means in response to signals generated upon readout of a ninth microinstruction word of said sequence from said control store; and, said second scratchpad memory location being operative during a tenth cycle of operation for storing said ninth data word representative of said CRC residue character in response to signals generated upon readout of a tenth microinstruction word of said sequence from said control store.

17. The apparatus of claim 16 wherein said cycle of operation is repeated a predetermined number of times after which said CRC residue character corresponds to said CRC character.

18. The apparatus of claim 17 wherein said CRC character is checked to verify that said CRC character has a value equal to zero after said predetermined number of said cycles of operation.

19. The apparatus of claim 16 wherein said predetermined number of bits of left shifting is 3 bits.

20. The apparatus of claim 19 wherein said predetermined number of bits of right rotating is 3 bits.

21. The apparatus of claim 20 wherein said predetermined constant is 000 111 111.

22. In a computing system comprising an arithmetic and logic unit (ALU), accumulator (AC), scratch pad memory (SPM), and register, coupled for communicating with each other via an input/output (I/O) bus, apparatus for generating a cyclic redundant check character comprising:

(a) means for storing first coded signals in said SPM representing a cyclic redundant check character;

(b) means for loading in said AC second coded signals representing new data for which a cyclic redundant check character is to be generated;

(c) a control store comprising:
  (i) first instruction means for controlling said ALU to exclusive OR said first coded signals with said second coded signals to generate a first result;
  (ii) second instruction means for controlling said AC to left shift said first result by a predetermined number of bits;
  (iii) third instruction means for controlling said ALU to exclusive OR said first result with said left shifted first result to generate a second result;
  (iv) fourth instruction means for controlling said ALU to AND said second result with a predetermined constant to generate a third result;
  (v) fifth instruction means for controlling said AC to right rotate said third result by a predetermined number of bit positions to generate a fourth result;
  (vi) sixth instruction means for controlling said AC to right rotate said fourth result by a predetermined number of bit positions to generate a fifth result;
  (vii) seventh instruction means for controlling said ALU to OR said fourth result and said fifth result to generate a sixth result; and
  (viii) eighth instruction means for controlling said ALU to AND said sixth result with a predetermined constant, whereby a cyclic redundant check character is generated; and (d) microprogram control means for actuating said first through eighth instruction means in the above-stated sequence after said first and second coded signals have been stored in said first and second means, respectively, to generate a cyclic redundant check character for said new data.

23. The apparatus set forth in claim 22 wherein said second instruction means controls said AC to left shift said first result three bit positions.

24. The apparatus set forth in claim 23 wherein said fourth instruction means controls said ALU to AND said second result with the binary constant 000111111.

25. The apparatus set forth in claim 24 wherein said fifth instruction means controls said AC to right rotate said third result three bit positions.

26. The apparatus set forth in claim 25 wherein said eighth instruction means controls said ALU to AND said sixth result with the binary constant 000111111.

* * * * *